(12) United States Patent
Kim et al.

(10) Patent No.: US 11,763,716 B2
(45) Date of Patent: Sep. 19, 2023

(54) DISPLAY PANEL AND DISPLAY DEVICE

(71) Applicant: LG Display Co., Ltd., Seoul (KR)

(72) Inventors: Miso Kim, Paju-si (KR); YongMin Ha, Paju-si (KR); Hanwook Hwang, Paju-si (KR); JungChul Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/562,347

(22) Filed: Dec. 27, 2021

(65) Prior Publication Data
US 2022/0208060 A1 Jun. 30, 2022

(30) Foreign Application Priority Data
Dec. 30, 2020 (KR) ........................ 10-2020-0188478

(51) Int. Cl.
*G09G 3/20* (2006.01)
*G06F 1/16* (2006.01)

(52) U.S. Cl.
CPC .............. *G09G 3/20* (2013.01); *G06F 1/1686* (2013.01); *G09G 2300/0426* (2013.01); *G09G 2300/0439* (2013.01)

(58) Field of Classification Search
CPC .............. G09G 3/20; G09G 2300/0426; G09G 2300/0439; G06F 1/1686
See application file for complete search history.

(56) References Cited

U.S. PATENT DOCUMENTS

| | | | |
|---|---|---|---|
| 2018/0174519 A1* | 6/2018 | Kim | H01L 33/06 |
| 2021/0065625 A1* | 3/2021 | Wang | G09G 3/2074 |
| 2021/0257419 A1* | 8/2021 | Jang | H01L 27/326 |
| 2022/0028949 A1* | 1/2022 | Ko | H01L 51/5225 |
| 2022/0189394 A1* | 6/2022 | Yang | G09G 3/20 |

* cited by examiner

*Primary Examiner* — Adam R. Giesy
(74) *Attorney, Agent, or Firm* — Seed IP Law Group LLP

(57) ABSTRACT

Embodiments of the present disclosure relate to a display panel and a display device, and more particularly, a display panel and a display device capable of reducing a bezel area by reducing the number of subpixels per unit area of a second display area adjacent to a first display area in which the light-receiving device is located.

19 Claims, 9 Drawing Sheets

DISPLAY PANEL AND DISPLAY DEVICE

CROSS REFERENCE TO RELATED APPLICATION

This application claims priority from Korean Patent Application No. 10-2020-0188478, filed on Dec. 30, 2020, which is hereby incorporated by reference for all purposes as if fully set forth herein.

BACKGROUND

Technical Field

Embodiments of the present disclosure relate to a display panel and a display device.

Description of the Related Art

With the development of technology, the display device may include a light-receiving device such as a camera. The light-receiving device of the display device may be located in front of the display device on which an image is displayed, and can be used for video calls or the like.

In order to position the light-receiving device on the front side of the display device, the light-receiving device may be located in a non-display area around the display area of the display device. However, in terms of aesthetic and practical aspects of the display device, the area of the non-display area located in front of the display device is gradually decreasing, and thus it is difficult to arrange the light-receiving device in the non-display area.

BRIEF SUMMARY

The inventors of the present disclosure have provided one or more embodiments to solve the technical problems in the related art as well as the above-described problem caused by having the light-receiving device located in the display area of the display device. For example, when the light-receiving device is positioned in the display area, it is difficult to secure a space for placing a wiring for driving a pixel positioned in the display area. Embodiments of the present disclosure is to provide a display panel and a display device capable of reducing a bezel area around a first display area by reducing the number of subpixels per unit area of a second display area adjacent to the first display area in which a light-receiving device is located.

In one aspect, embodiments of the present disclosure provide a display panel including a substrate, a transistor layer disposed over the substrate, a planarization layer disposed over the transistor layer, and a light emitting element layer disposed over the planarization layer.

The substrate comprises a plurality of subpixels.

The substrate comprises a first display area, a second display area, and a third display area. The second display area is located adjacent to the first display area. The number of subpixels per unit area in the first display area is smaller than the number of subpixels per unit area in the third display area. The number of subpixels per unit area in the second display area is smaller than the number of subpixels per unit area in the third display area.

The light emitting element layer comprises a common electrode. The common electrode comprises a plurality of holes in the first display area.

The substrate may comprise an active area and a non-active area.

The first display area, the second display area, and the third display area are located in the active area, and the second display area is located at the boundary between the non-active area and the active area.

The substrate may comprise a bezel area surrounding the first display area. The transistor layer may comprise a display wiring located in the bezel region. The display wiring may be a wiring that applies a signal to the second display area.

The display wiring may be a data line.

The first display area may comprise a pixel area, a wiring area, and a transmissive area.

The common electrode may be positioned so as not to overlap the transmissive area.

The common electrode may be located substantially all over the second display area and the third display area.

In another aspect, embodiments of the present disclosure may provide a display device including a display panel and a control unit driving the display panel.

According to embodiments of the present disclosure, it can be provided that a display panel and a display device capable of reducing a bezel area around a first display area by reducing the number of subpixels per unit area of a second display area adjacent to the first display area in which a light-receiving device is located.

DETAILED DESCRIPTION

Figure 1:
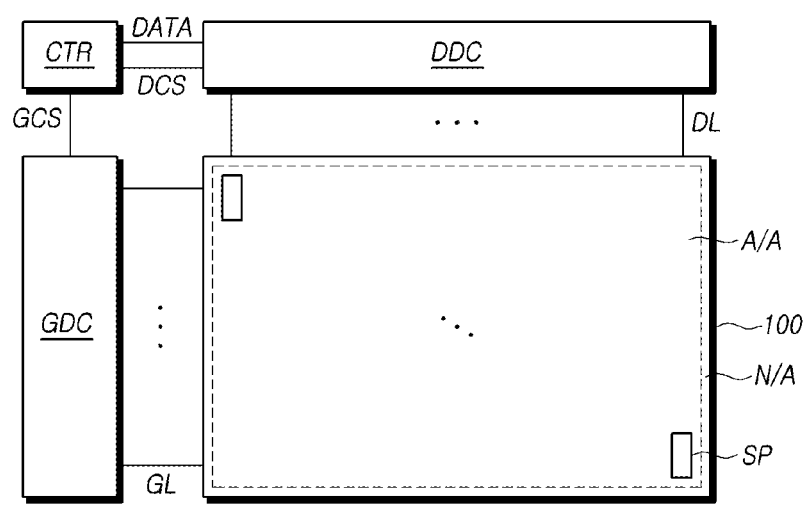
FIG. 1 is a system configuration diagram of a display device according to example embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 illustrates a display device according to embodiments of the present disclosure.

Referring to FIG. 1, a display device 10 according to embodiments of the present disclosure includes a display panel 100 including an active area (A/A) and a non-active area (N/A), a gate driving circuit (GDC), a data driving circuit (DDC), and a controller (CTR) as a control unit for driving the display panel 100.

In the display panel 100, a plurality of gate lines (GL) and a plurality of data lines (DL) are disposed, and a subpixel (SP) is disposed in a region where the gate line (GL) and the data line (DL) cross each other. Also, the display panel 100 may be a liquid crystal panel. The liquid crystal panel may include a pixel electrode, a common electrode, and a liquid crystal layer disposed between the pixel electrode and the common electrode. The liquid crystal panel may include a pixel electrode, a common electrode, and a liquid crystal layer disposed between the pixel electrode and the common electrode. The liquid crystal layer may display an image by blocking or transmitting light by deforming the molecular arrangement in response to a voltage applied to the pixel electrode and the common electrode.

The gate driving circuit (GDC) is controlled by the controller (CTR). The gate driving circuit (GDC) may control driving timings of the plurality of subpixels (SP) by sequentially outputting scan signals to the plurality of gate lines (GL) disposed over the display panel 100.

The data driving circuit (DDC) may receive image data from the controller (CTR) and convert the image data into an analog data voltage. When the data driving circuit (DDC) outputs the data voltage to each data line (DL) according to the timing at which the scan signal is applied through the gate line (GL), each sub-pixel (SP) increases brightness according to the image data.

The controller (CTR) supplies various control signals to the gate driving circuit (GDC) and the data driving circuit (DDC), and the controller (CTR) controls the operation of the gate driving circuit (GDC) and the data driving circuit (DDC). Can be controlled.

The display device 10 may further comprise a power management integrated circuit. The power management integrated circuit supplies various voltages or currents to the display panel 100, a gate driving circuit (GDC), a data driving circuit (DDC), or the like, or controls various voltages or currents to be supplied.

The display device 10 according to the present embodiments may be an organic light emitting display device, a liquid crystal display device, a plasma display device, or the like.

When the display device 10 according to the present embodiments is an organic light emitting display device, each sub-pixel (SP) arranged on the display panel 100 consists of an organic light emitting diode (OLED) that is a self-luminous device, and circuit elements such as a driving transistor for driving the organic light emitting diode (OLED).

The type and number of circuit elements constituting each subpixel (SP) may be variously determined according to a provision function and a design method.

Figure 2:
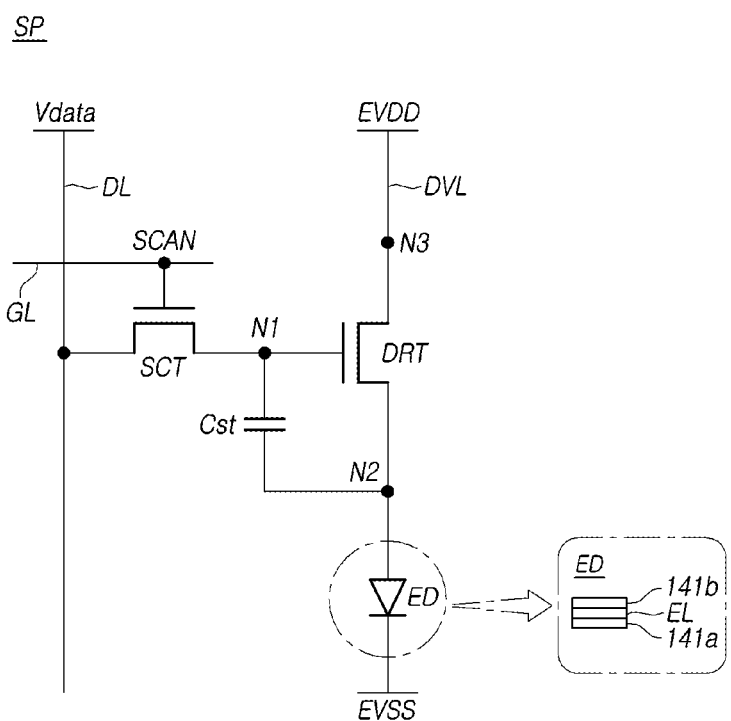
FIG. 2 is an equivalent circuit diagram of subpixels of a display panel according to example embodiments of the present disclosure.

FIG. 2 is an equivalent circuit of a subpixel (SP) of the display device 10 according to embodiments of the present disclosure.

Referring to FIG. 2, each of the plurality of subpixels (SP) disposed over the display panel 100 of the display device 10 according to the embodiments of the present disclosure comprises a light emitting element (ED), a driving transistor (DRT), a scan transistor (SCT), and a storage capacitor (Cst).

The light emitting element (ED) may comprise a pixel electrode 141b and a common electrode 141a, and an light emitting layer (EL) positioned between the pixel electrode 141b and the common electrode 141a. The pixel electrode 141b may be disposed in each subpixel (SP), and the common electrode 141a may be disposed in common with a plurality of subpixels (SP). For example, the pixel electrode 141b may be an anode electrode, and the common electrode 141a may be a cathode electrode. For another example, the pixel electrode 141b may be a cathode electrode, and the common electrode 141a may be an anode electrode. For example, the light emitting element (ED) may be an organic light emitting diode (OLED), a micro light emitting diode (LED), a quantum dot light emitting element, or the like.

The driving transistor (DRT) is a transistor for driving the light emitting element (ED), and may comprise a first node (N1), a second node (N2), a third node (N3), and the like.

The first node (N1) of the driving transistor (DRT) may be a gate node of the driving transistor (DRT), and may be electrically connected to a source node or a drain node of the scan transistor (SCT). The second node (N2) of the driving transistor (DRT) may be a source node or a drain node of the driving transistor (DRT), and may be electrically connected to the pixel electrode 141b of the light emitting element (ED). The third node (N3) of the driving transistor (DRT) may be electrically connected to the driving voltage line (DVL) supplying the driving voltage (EVDD).

The scan transistor (SCT) is controlled by the scan signal (SCAN) and may be connected between the first node (N1)

of the driving transistor (DRT) and the data line (DL). The scan transistor (SCT) is turned on or off according to the scan signal (SCAN) supplied from the gate line (GL), and thus can control the connection between the data line (DL) and the first node (N1) of the driving transistor (DRT).

The scan transistor (SCT) is turned on by a scan signal (SCAN) having a turn-on level voltage, so that the data voltage (Vdata) supplied from the data line (DL) can be delivered to the node (N1) of the driving transistor (DRT).

Each of the driving transistor (DRT) and the scan transistor (SCT) may be an n-type transistor or a p-type transistor.

The storage capacitor (Cst) may be connected between the first node (N1) and the second node N2 of the driving transistor (DRT). The storage capacitor (Cst) charges the amount of charge corresponding to the voltage difference between both ends and maintains the voltage difference between both ends for a predetermined frame time (or a selected frame time). Accordingly, during a predetermined frame time (or a selected frame time), the subpixel (SP) may emit light.

The storage capacitor (Cst) is not a parasitic capacitor (e.g., Cgs, Cgd), which is an internal capacitor existing between the gate node and the source node (or drain node) of the driving transistor (DRT), but may be an external capacitor intentionally designed outside the driving transistor (DRT).

The subpixel (SP) of the display device 10 according to the embodiments may further comprise one or more transistors or may further comprise one or more capacitors.

Figure 3:
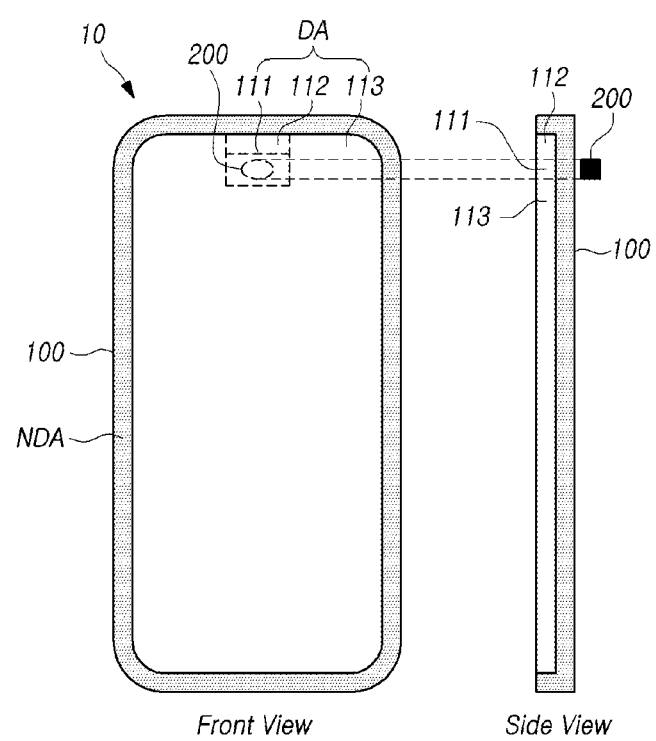
FIG. 3 illustrates a display device according to embodiments of the present disclosure.

FIG. 3 shows a display device 10 according to embodiments of the present disclosure.

Referring to FIG. 3, the display device 10 according to embodiments of the present disclosure may comprise a display panel 100 displaying an image and a light-receiving device 200 receiving light.

The display panel 100 may comprise a substrate and a plurality of insulating films, transistor layers, light emitting element layers, and the like over the substrate.

The display panel 100 may comprise a plurality of subpixels for displaying an image and various signal lines for driving the plurality of subpixels. The signal lines may comprise a plurality of data lines, a plurality of gate lines, and a plurality of power lines. Here, each of the plurality of subpixels may comprise a transistor positioned in the transistor layer and a light emitting element positioned in the light emitting element layer.

The display panel 100 may comprise a display area (DA) in which an image is displayed and a non-display area (NDA) that is an area outside the display area (DA). A plurality of subpixels may be disposed in the display area (DA). The display area (DA) is also referred to as an active area.

Various signal wires may be disposed in the non-display area (NDA), and a driving circuit may be connected to the non-display area (NDA). The non-display area (NDA) may be bent and not visible from the front surface or may be covered by a case (not shown), and is also called a bezel or a non-active area.

Referring to FIG. 3, the display area (DA) may comprise a first display area (111), a second display area (112), and a third display area (113).

The second display area (112) may be located adjacent to the first display area (111).

The second display area (112) may be located at a boundary between the non-active area and the active area.

The light-receiving device 200 is a device that receives light and performs a predetermined function. For example, the light-receiving device 200 may comprise one or more of a camera and a proximity sensor.

The light-receiving device 200 may be a device requiring light reception, but may be located behind (below) the display panel 100. That is, the light-receiving device 200 may be located on the opposite side of the viewing surface of the display panel 100. The light-receiving device 200 is not exposed on the front surface of the display device 10. Therefore, when the user looks at the front of the display device 110, the light-receiving device 200 is not visible.

The camera positioned behind (below) the display panel 100 is a front camera that photographs the front side, and may be viewed with a camera lens.

Referring to FIG. 3, a part of the light-receiving device 200 may be disposed to overlap the display area (DA) of the display panel 100. That is, the light-receiving device 200 may be located in the display area (DA).

In the display area (DA), an area overlapping the light-receiving device 200 is called a first display area (111), and a predetermined area (or a selected area) adjacent to the first display area (111) is called a second display area (112). The remaining area is referred to as a third display area (113). Accordingly, a part of the light-receiving device 200 may be positioned to overlap the first display area (111) in the display area (DA). In other words, the light-receiving device 200 can be considered to be positioned in the first display area (111) in the display area (DA).

A part of the first display area (111) in the display area (DA) is an area overlapping the light-receiving device 200. Accordingly, the first display area (111) in the display area (DA) should have a higher transmittance than the second display area (112) and the third display area (113) which do not overlap with the light-receiving device 200.

In order to improve the transmittance of the first display area (111) a part of which overlaps with the light-receiving device 200, resolution, subpixel arrangement structure, number of subpixels per unit area, electrode structure, wiring structure, electrode arrangement structure, or wiring arrangement, etc., may vary from each other in the first display area (111), the second display area (112), and the third display area (113).

For example, the number of subpixels per unit area in the first display area (111) may be smaller than the number of subpixels per unit area in the third display area (113). Accordingly, the resolution of the first display area (111) may be lower than that of the third display area (113).

In the display device 10 according to embodiments of the present disclosure, as the light-receiving device 200 positioned under the display panel 100 without being exposed to the outside, the camera is also referred to as an Under Display Camera (UDC).

The display device 10 according to embodiments of the present disclosure can have a smaller bezel and may not have a notch-shaped display panel 100. In addition, the display device 10 has no design restrictions due to the light-receiving device 200, and thus a degree of freedom in design may be increased.

In the display device 10 according to the embodiments of the present disclosure, although the light-receiving device 200 is positioned behind the display panel 100, the light-receiving device 200 should receive light and perform a predetermined function normally. In addition, in the display device 10 according to embodiments of the present disclosure, although the light-receiving device 200 is positioned behind the display panel 100 and a part of which overlaps with the display area (DA), the light-receiving device 200 should be able to receive light normally to perform a specified function normally, and should be able to display a normal image in the display area (DA).

Accordingly, the display device 10 according to embodiments of the present disclosure provides a structure capable of improving the transmittance of the first display area 111 a part of which overlaps the light-receiving device 200.

Figure 4:
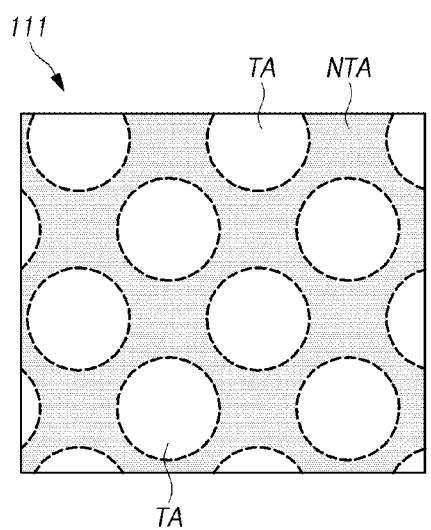
FIG. 4 and FIG. 5 illustrate a first display area of a display panel according to embodiments of the present disclosure.
Figure 5:
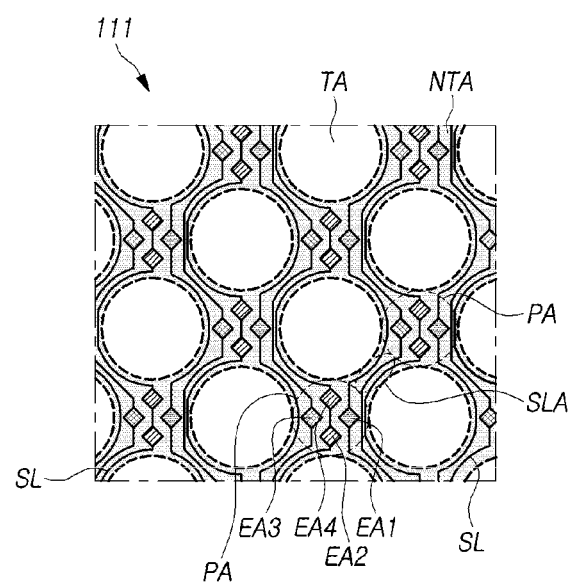

Referring to FIGS. 4 and 5, a part of the first display area 111 overlaps with the light-receiving device 200. The first display area 111 may comprise a non-transmissive area (NTA) and a transmissive area (TA).

Referring to FIGS. 4 and 5, the transmission area (TA) is a partial area comprised in the first display area 111 and may be an area through which external light is transmitted to the light-receiving device 200. For example, the transmission area (TA) may have a circular or elliptical shape, and may also be referred to as a hole area.

Referring to FIGS. 4 and 5, the non-transmissive area (NTA) is a partial area comprised in the first display area 111, and may be an area in which the transistors of the transistor layer and the light emitting elements of the light emitting element layer are located.

Referring to FIGS. 4 and 5, the non-transmissive area (NTA) comprises a pixel area 112 in which the light emitting areas (EA1, EA2, EA3, and EA4) of the subpixels are present, a wiring area 113 in which the signal line (SL) is disposed.

Referring to FIGS. 4 and 5, when the transmissive area (TA) is surrounded by the non-transmissive area (NTA), the first display area (111) may comprise a plurality of transmissive areas (TA) separated from each other.

Figure 6:
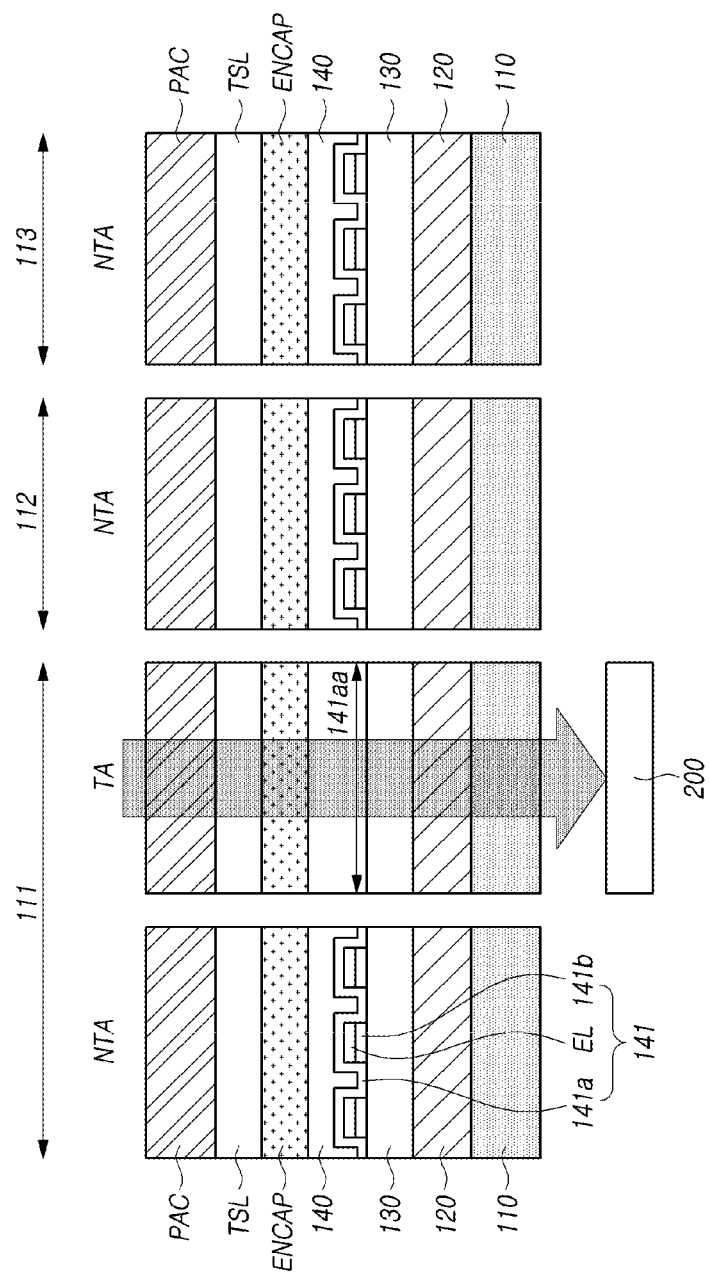
FIG. 6 is a schematic cross-sectional view of a display panel according to embodiments of the present disclosure.

FIG. 6 illustrates a cross-sectional structure of a non-transmissive area (NTA) in the first display area 111, a cross-sectional structure of a transmissive area (TA) in the first display area 111 in the display device 10, and a cross-sectional structure of the third display area 113 according to embodiments of the present disclosure.

Referring to FIG. 6, the first display area 111 of the display panel 100 may comprise a transmissive area (TA) and a non-transmissive area (NTA). The third display area 113 of the display panel 100 may be a non-transmissive area (NTA).

FIG. 6 illustrates a stacked structure of a non-transmissive area (NTA) in the first display area 111, a stacked structure of a transmissive area (TA) in the first display area 111, and a stacked structure of the second display area 112 and the third display area 113.

Referring to FIG. 6, the stacked structure of the second display area 112 is as follows.

Referring to FIGS. 4 and 5, the non-transmissive area (NTA) comprises a pixel area PA in which the light emitting areas (EA1, EA2, EA3, and EA4) of the subpixels are present, a wiring area 113 in which the signal line (SL) is disposed.

In the second display area 112, transistors such as a driving transistor (DRT) and a scan transistor (SCT) of each subpixel (SP) may be disposed in the transistor layer 120, and various insulating films may be disposed in the transistor layer 120. Here, various insulating films may comprise an organic layer and an inorganic layer.

In the second display area 112, various wirings such as a data line (DL), a gate line (GL), and a driving voltage line (DVL) may be disposed in the transistor layer 120.

In the second display area 112, the light emitting element (ED) of each subpixel (SP) may be disposed in the light emitting element layer 140. Accordingly, in the second display area 112, the pixel electrode 141*b* constituting the light emitting element (ED), the light emitting layer (EL), and the common electrode 141*a* may be disposed in the light emitting element layer 140.

In the second display area 112, a touch sensor (TS) may be disposed over the touch sensor layer (TSL), and a touch buffer layer and a touch insulating film required to form the touch sensor (TS) may be further disposed.

Referring to FIG. 6, the stacked structure of the non-transmissive area (NTA) in the third display area 113 is the same as the stacked structure of the second display area 112.

Referring to FIG. 6, the stacked structure of the non-transmissive area (NTA) in the first display area 111 is the same as the stacked structure of the third display area 113.

In the non-transmissive area (NTA) of the first display area 111, the transistor layer 120 may be disposed over the substrate 110, and the planarization layer 130 may be disposed over the transistor layer 120, and the light emitting element layer 140 is disposed over the planarization layer 130, the encapsulation layer (ENCAP) may be disposed over the light emitting element layer 140, the touch sensor layer (TSL) may be disposed over the encapsulation layer (ENCAP), a protective layer (PAC) may be disposed over the touch sensor layer (TSL).

The light emitting element (ED) is vulnerable to moisture or oxygen. The encapsulation layer (ENCAP) may prevent penetration of moisture or oxygen, thereby preventing the light emitting element (ED) from being exposed to moisture or oxygen. The encapsulation layer (ENCAP) may be composed of one layer, but may be composed of a plurality of layers.

In the non-transmissive area (NTA) of the first display area 111, transistors such as the driving transistor (DRT) and the scan transistor (SCT) of each subpixel (SP) may be disposed in the transistor layer 120. In addition, various insulating films for forming transistors may be disposed. Here, various insulating films may comprise an organic layer and an inorganic layer.

In the non-transmissive area (NTA) of the first display area 111, various wirings such as a data line (DL), a gate line (GL), and a driving voltage line (DVL) may be disposed over the transistor layer 120.

In the non-transmissive area (NTA) of the first display area 111, the light emitting element (ED) of each subpixel (SP) may be disposed in the light emitting element layer 140. Accordingly, in the second display area 112, the pixel electrode 141*b* constituting the light emitting element (ED), the light emitting layer (EL), and the common electrode 141*a* may be disposed in the light emitting element layer 140.

In the non-transmissive area (NTA) of the first display area 111, a touch sensor (TS) may be disposed in the touch sensor layer (TSL), and a touch buffer layer and a touch insulating film or the like required to form the touch sensor (TS) may be further disposed.

Referring to FIG. 6, the stacked structure of the transmissive area (TA) in the first display area 111 is as follows.

Referring to FIG. 6, in the transmissive area (TA) of the first display area 111, a transistor layer 120 may be disposed over a substrate 110, and a planarization layer 130 may be disposed over the transistor layer 120, the light emitting element layer 140 may be disposed over the planarization layer 130, the encapsulation layer (ENCAP) may be disposed over the light emitting element layer 140, and the touch sensor layer (TSL) may be disposed on the encapsulation layer (ENCAP), and a protective layer (PAC) may be disposed over the touch sensor layer (TSL).

In the transmission area (TA) of the first display area 111, transistors such as the driving transistor (DRT) and the scan transistor (SCT) of each subpixel (SP), and various wirings may be disposed in the transistor layer 120. In addition, the light emitting element (ED) of each subpixel (SP) may be disposed in the light emitting element layer 140, and in the second display area 112, touch sensor (TS) may be disposed in the touch sensor layer (TSL).

In the transmissive area (TA) of the first display area 111, transistors and wirings are not disposed in the transistor layer 120. However, in the transmissive area (TA) of the first display area 111, various insulating films for forming a transistor may be disposed in the transistor layer 120. Here, various insulating films may comprise an organic layer and an inorganic layer.

In the transmissive area (TA) of the first display area 111, the light emitting element (ED) of each subpixel (SP) is not disposed in the light emitting element layer 140. Accordingly, in the transmissive area (TA) of the first display area 111, the pixel electrode 141b, the light emitting layer (EL), and the common electrode 141a are not disposed in the light emitting element layer 140. That is, the common electrode 141a comprises a plurality of holes 141aa in the first display area 111. The plurality of holes 141aa may be positioned corresponding to the transmission area (TA). In some cases, in the transmission area (TA) of the first display area 111, only a portion of the pixel electrode 141b, the light emitting layer (EL), and the common electrode 141a may be disposed in the light emitting element layer 140. For example, in the transmission area (TA) of the first display area 111, only the light emitting layer (EL) may be disposed over the light emitting element layer 140.

The common electrode 141a may be located substantially all over the second display area 112 and the third display area 113.

In the transmissive area (TA) of the first display area 111, the touch sensor (TS) is not disposed in the touch sensor layer (TSL). However, in the transmissive area (TA) of the first display area 111, a touch buffer layer and a touch insulating film or the like may be disposed in the touch sensor layer (TSL).

Referring to FIG. 6, among the metal material layer and the insulating material layer disposed in the non-transmissive area (NTA) of the first display area 111 and the third display area 113, the metal material layer is not disposed in the transmissive area (TA) of the first display area (111). However, among the metal material layer and the insulating material layer disposed in the non-transmissive area (NTA) of the first display area 111 and the third display area 113, the insulating material layer can be extended to be disposed in the transparent area (TA) of the first display area 111.

In other words, the metal material layer is disposed in the non-transmissive area (NTA) of the first display area 111 and the non-transmissive area (NTA) of the third display area 113, and is not disposed in the transmission area (TA) of the first display area 111. The insulating material layer may be commonly disposed in the non-transmissive area (NTA) of the first display area 111, the non-transmissive area (NTA) of the third display area 113, and the transmissive area (TA) of the first display area 111.

Referring to FIG. 6, a part of the transmission area (TA) of the first display area 111 of the display panel 100 may overlap the light-receiving device 200.

External light is transmitted to the light-receiving device 200 through the transmission area (TA) of the first display area 111. Accordingly, in order for the light-receiving device 200 to operate normally, the transmittance of the transmission area (TA) in the first display area 111 must be high.

Figure 7:
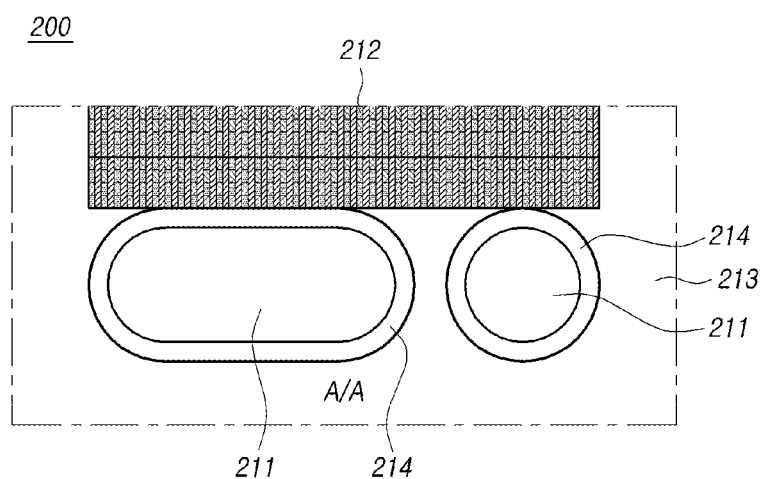
FIG. 7 is a plan view of a portion of an active area of a display panel according to a comparative example of the present disclosure.

FIG. 7 is a top view of a portion of an active area of the display panel 200 according to a comparative example of the present disclosure.

Referring to FIG. 7, in the display panel 200 according to the comparative example, a light-receiving device may be located in an area 211 corresponding to the first display area of the display panel according to embodiments of the present disclosure.

In the display panel 200, the number of subpixels per unit area of the area 212 corresponding to the second display area of the display panel according to the embodiments of the present disclosure is equal to the number of subpixels per unit area of the area 213 corresponding to the third display area of the display panel according to the embodiments of the present disclosure.

Display wiring for applying signals to the subpixels located in the area 212, for example, some of the data lines may be connected to the subpixel located in the area 212 by bypassing the area 211 through the bezel 214 located at the periphery of the area 211.

However, even though the number of subpixels per unit area of the area 212 of the display panel 200 is the same as the area 213, since the display wiring must bypass the area 211, the area occupied by the bezel 214 is wider than the display panel according to the embodiments.

Figure 8:
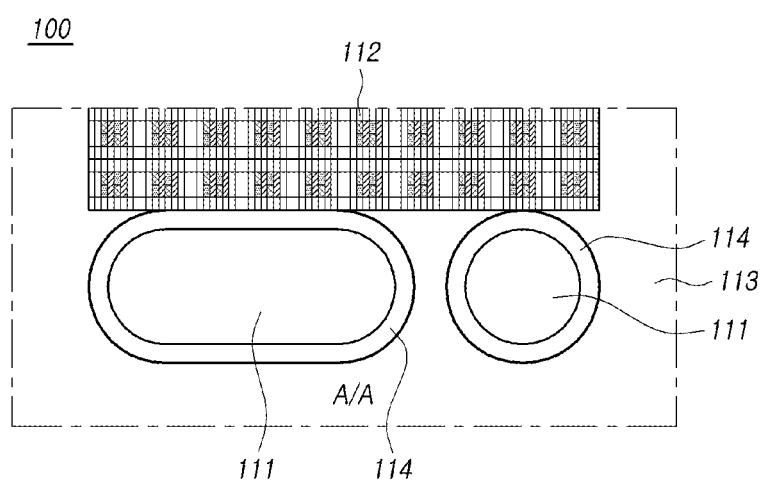
FIG. 8 and FIG. 9 are plan views of a portion of an active area of a display panel according to example embodiments.

FIG. 8 is a plan view illustrating a part of an active area of a display panel according to example embodiments.

Referring to FIG. 8, the substrate may comprise a bezel area 114 surrounding the first display area 111. The bezel area 114 surrounding the first display area 111 is also referred to as a hole bezel.

A display wiring connected to a subpixel positioned in the second display area 112 may be positioned in the bezel area 114 that is a hole bezel.

The number of subpixels per unit area in the second display area 112 is smaller than the number of subpixels per unit area in the third display area 113. Referring to FIGS. 7 and 8, the number of subpixels per unit area of the second display area 112 in the display panel 100 according to embodiments is smaller than the number of subpixels per unit area of the area 212. Since the number of subpixels per unit area of the second display area 112 is smaller than the number of subpixels per unit area of the third display area 113, the display panel 100 can reduce the area of the bezel area 114 in which the display wiring connected to subpixels located in the second display area 112 is located.

The second display area 112 has a lower resolution than the third display area 113. However, since the second display area 112 is located at a relatively insignificant border between an active area (A/A) and a non-active area, it is possible to prevent the user from easily recognizing the degradation of display quality due to low resolution.

In addition, since the second display area 112 is located near the first display area 111 having a low resolution in order to secure the transmission area by the light receiving device, the luminance compensation algorithm is applied to the first display area 111 and the second display area 112 so that the first display area 111 and the second display area 112 display a uniform image with the third display area 113.

In addition, the number of subpixels per unit area of the first display area 111 and the number of subpixels per unit area of the second display area 112 are substantially the same, so that the first display area 111 and the second display area 112 can have uniform display quality.

Figure 9:
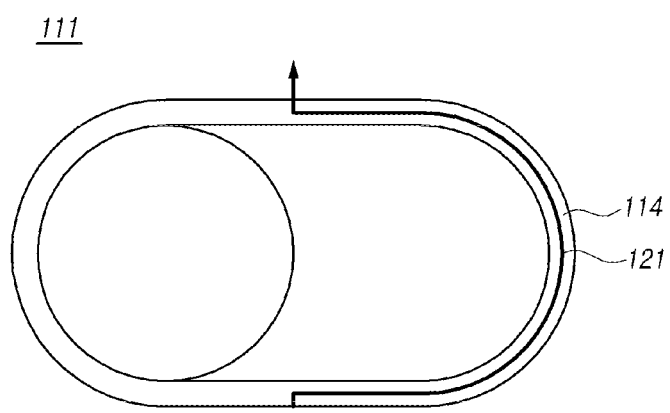

FIG. 9 illustrates display wiring positioned on a hole bezel of a display panel according to example embodiments of the present disclosure.

Referring to FIG. 9, the display wiring 121 may be located in the bezel area 114 to bypass the first display area 111 and connect to subpixels located in the second display area.

Referring to FIGS. 8 and 9, since the number of subpixels per unit area of the second display area 112 is smaller than the number of subpixels per unit area of the third display area 113, a small number of display wirings may be used to drive the subpixels of the second display area 112. Accordingly, the area of the hole bezel can be reduced.

The display wiring 121 may be located in the transistor layer. The display wiring 121 is a wiring that applies a signal to the second display area, and the display wiring 121 may be a data line.

In another aspect, embodiments of the present disclosure may provide a display device including a display panel and a control unit driving the display panel.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown. All technical ideas within the scope of the present disclosure should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
a substrate including a plurality of subpixels, a first display area, a second display area located adjacent to the first display area, and a third display area, and the substrate having a smaller number of subpixels per unit area in the first display area and in the second display area than in the third display area, the first display area having a transmissive area and a non-transmissive area adjacent to the transmissive area;
a transistor layer over the substrate;
a planarization layer over the transistor layer; and
a light emitting element layer disposed over the planarization layer, the light emitting element including a common electrode, a pixel electrode, and a light emitting layer between the common electrode and the pixel electrode,
wherein, in the transmissive area of the first display area, the planarization layer does not overlap with the common electrode and the pixel electrode of the light emitting element in a lateral direction.

2. The display panel according to claim 1, wherein the substrate comprises an active area and a non-active area,
wherein the first display area, the second display area, and the third display area are located in the active area, and
wherein the second display area is located at a boundary between the non-active area and the active area.

3. The display panel according to claim 1, wherein the substrate comprises a bezel area surrounding the first display area, and
wherein the transistor layer is located in the bezel area and the transistor layer includes a display wiring for applying a signal to the second display area.

4. The display panel according to claim 3, wherein the display wiring is a data line.

5. The display panel according to claim 1, wherein the first display area further includes a pixel area, and a wiring area, and
wherein the common electrode is located so as not to overlap the transmissive area.

6. The display panel according to claim 1, wherein the common electrode is located substantially all over the second display area and the third display area.

7. A display device comprising:
display panel; and
a control circuit driving the display panel, and
wherein the display panel includes:
a substrate having thereon a plurality of subpixels, a first display area, a second display area located adjacent to the first display area, and a third display area, and the substrate having a smaller number of subpixels per unit area in the first display area and in the second display area than in the third display area, the first display area having a transmissive area and a non-transmissive area adjacent to the transmissive area;
a transistor layer on the substrate;
a planarization layer on the transistor layer; and
a light emitting element layer on the planarization layer, the light emitting element including a common electrode, a pixel electrode, and a light emitting layer between the common electrode and the pixel electrode,
wherein the planarization layer does not vertically and horizontally overlap with the common electrode and the pixel electrode of the light emitting element in the transmissive area of the first display area.

8. The display device according to claim 7,
wherein the substrate includes an active area and a non-active area,
wherein the first display area, the second display area, and the third display area are located in the active area, and
wherein the second display area is located at a boundary between the non-active area and the active area.

9. The display device according to claim 7, wherein the substrate comprises a bezel area adjacent to the first display area, and wherein the transistor layer is located in the bezel area and includes a display wiring for applying a signal to the second display area.

10. The display device according to claim 9, wherein the display wiring includes a data line.

11. The display device according to claim 7, wherein the first display area further includes a pixel area a wiring area, and a wiring area, and
wherein the common electrode is located so as not to overlap the transmissive area.

12. The display device according to claim 7, wherein the common electrode is located substantially all over the second display area and the third display area.

13. A display device comprising:
a substrate having thereon a plurality of subpixels, a first display area, a second display area located adjacent to the first display area, and a third display area, the first display area and the second display area having a smaller number of subpixels per unit area than in the third display area, the first display area having a transmissive area and a non-transmissive area adjacent to the transmissive area;
a planarization layer on the substrate; and
a light emitting element layer on the planarization layer, the light emitting element including a common electrode, a pixel electrode, and a light emitting layer between the common electrode and the pixel electrode,
wherein either the common electrode or the pixel electrode of the light emitting element is not present in the transmissive area of the first display area.

14. The display device according to claim 13, wherein the substrate comprises an active area and a non-active area,
wherein the first display area, the second display area, and the third display area are located in the active area, and
wherein the second display area is located at a boundary between the non-active area and the active area.

15. The display device according to claim 13, further comprising a transistor layer between the substrate and the planarization layer,
wherein the substrate comprises a bezel area adjacent to the first display area, and
wherein the transistor layer is located in the bezel area and the transistor layer includes a display wiring for applying a signal to the second display area.

16. The display device according to claim 15, wherein the display wiring includes a data line.

17. The display device according to claim 13, wherein the first display area further includes a pixel area and a wiring area, and
wherein the common electrode is located so as not to overlap the transmissive area.

18. The display device according to claim 13, wherein the common electrode is located substantially all over the second display area and the third display area.

19. The display device according to claim 13, wherein the common electrode is continuously disposed over the first display area, the second display area, and the third display area excepting the transmissive area of the first display area.

* * * * *

UNITED STATES PATENT AND TRADEMARK OFFICE
CERTIFICATE OF CORRECTION

| | | |
|---|---|---|
| PATENT NO. | : 11,763,716 B2 | Page 1 of 1 |
| APPLICATION NO. | : 17/562347 | |
| DATED | : September 19, 2023 | |
| INVENTOR(S) | : Miso Kim et al. | |

It is certified that error appears in the above-identified patent and that said Letters Patent is hereby corrected as shown below:

In the Claims

Column 13, Claim 11, Line 7:
"a pixel area a wiring area, and a wiring area, and"
Should read:
--a pixel area and a wiring area, and--.

Signed and Sealed this
Twenty-third Day of July, 2024

Katherine Kelly Vidal
*Director of the United States Patent and Trademark Office*